United States Patent
Cha

(10) Patent No.: US 6,885,578 B2
(45) Date of Patent: Apr. 26, 2005

(54) NAND-TYPE MAGNETORESISTIVE RAM

(75) Inventor: Seon Yong Cha, Cheongju-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 2 days.

(21) Appl. No.: 10/608,195

(22) Filed: Jun. 30, 2003

(65) Prior Publication Data

US 2004/0113187 A1 Jun. 17, 2004

(30) Foreign Application Priority Data

Dec. 16, 2002 (KR) .................................. 10-2002-0080181

(51) Int. Cl.[7] .............................................. G11C 11/00
(52) U.S. Cl. ...................... 365/158; 365/171; 365/173
(58) Field of Search ................................ 365/158, 157, 365/72, 171, 173

(56) References Cited

U.S. PATENT DOCUMENTS 6,683,807 B1 * 1/2004 Hidaka ........................ 365/161
6,693,822 B1 * 2/2004 Ito .............................. 365/158
6,724,653 B1 * 4/2004 Iwata et al. .................. 365/158
6,804,144 B1 * 10/2004 Iwata ......................... 365/158

* cited by examiner

Primary Examiner—Michael S. Lebentritt
Assistant Examiner—Toan Le
(74) Attorney, Agent, or Firm—Heller Ehrman White and McAuliffe LLP

(57) ABSTRACT

The present invention generally relates to a NAND-type magnetoresistive RAM, and more specifically, to a NAND-type magnetoresistive RAM comprising a plurality of transistors connected in series as a NAND-type which can reduce the effective area per cell. Two or more NAND-type transistors sharing an adjacent source region and an adjacent drain region are connected in series, thereby reducing inactive regions. A read node connected to a bitline is shared by a plurality of transistors, thereby improving a read operation. As a result, the effective area per cell can be decreased, and the integration of a device can be improved.

7 Claims, 6 Drawing Sheets

NAND-TYPE MAGNETORESISTIVE RAM

BACKGROUND OF THE INVENTION

1. Field of the Invention

The present invention relates to a NAND-type magnetoresistive RAM, and more specifically, to an improved cell structure of a magnetoresistive RAM, thereby reducing an effective area per cell and improving integration of a device.

2. Description of the Related Art

Recently, semiconductor memory manufacturers have developed a magnetoresistive RAM using ferromagnetic materials as a next generation memory device.

The magnetoresistive RAM having a multi-layered structure of ferromagnetic thin films is a memory device which can read and write data by detecting current variations depending on direction of magnetization of each thin film. The magnetoresistive RAM has a high operating speed, large capacitance and low power consumption due to characteristics of magnetic thin film. A nonvolatile memory operation performed on a flash memory can be performed on the magnetoresistive RAM.

The study on the magnetoresistive RAM is in the initial stage, and focused on formation of multi-layered magnetic thin films. The studies on unit cell structures or adjacent detection circuit are still on the early stage FIG. 1 illustrates a cross-sectional diagram of a MTJ cell (Magnetic Tunnel Junction cell), having a multi-layered magnetic thin film structure, of a conventional magnetoresistive RAM.

In general, a MTJ cell 5 is formed of an anti-ferroelectric layer 1, a fixed ferromagnetic layer 2, a thin insulating layer 3 where tunneling current flows and a free ferromagnetic layer 4.

Here, the fixed ferromagnetic layer 2 has an fixed direction of magnetization. The anti-ferroelectric layer 1 fixes the direction of magnetization of the fixed ferromagnetic layer 2. However, direction of magnetization of the free ferromagnetic layer 4 are changed by an external magnetic field. The free ferromagnetic layer 4 can store data "0" or "1" depending on its direction of magnetization.

When current flows vertically in the MTJ cell 5, tunneling current is generated through the thin insulating layer 3. Here, if the direction of magnetization of the fixed ferromagnetic layer 2 is the same with that of the free ferromagnetic layer 4, the large amount of the tunneling current flows. However, if the direction of magnetization of the fixed ferromagnetic layer 2 is opposite to that of the free ferromagnetic layer 4, the small amount of the tunneling current flows.

This phenomenon is called a TMR (Tunneling Magnetoresistance) effect. By detecting the amount of the tunneling current, the direction of magnetization of the free ferromagnetic layer 4 can be found out, and data stored in a cell can be read.

FIG. 2a illustrates a unit cell of the conventional magnetoresistive RAM using a field effect transistor.

The unit cell of the magnetoresistive RAM comprises a the MTJ cell 5, a read wordline 6, a bitline 7, a write wordline 8 and a MOS(metal-oxide-silicon) field effect transistor 9.

Here, the read wordline 6 is used when data is read. The write wordline 8 forms an external magnetic field according to application of current. As a result, data can be stored depending on variations of direction of magnetization of the free ferromagnetic layer 4 in the MTJ cell 5. The bitline 7 applies current vertically to the MTJ cell 5. As a result, the direction of magnetization of the free ferromagnetic layer 4 can be found out.

In the conventional magnetoresistive RAM, the MOS field effect transistor 9 is operated by applying a voltage to the read wordline 6 in a read mode. Then, the amount of current flowing in the MTJ cell 5 is detected after current is applied to the bitline 7.

In a write mode, the MOS field effect transistor 9 is maintained at an off state, and the current is applied to the wordline 8 and the bitline 7. A resultant external magnetic field changes the direction of magnetization of the free ferromagnetic layer 4 in the MTJ cell 5.

Here, the current is simultaneously applied to the bitline 7 and write wordline 8 because the largest magnetic field is generated at a point where the two metal lines are vertically crossed. As a result, one cell is selected among a plurality of cells.

FIG. 2b illustrates a cross-sectional diagram of the unit cell of the conventional magnetoresistive RAM.

Referring to FIG. 2b, a ground line 12 is formed on a source 10 of the vertical MOS field effect transistor 9. The read wordline 6 is formed on a gate of the MOS field effect transistor 9. A conductive layer 13, a contact plug 14, a conductive layer 15 and a contact plug 16 are sequentially formed on a drain 11 of the MOS field effect transistor 9. A connection layer 17 is formed on the write wordline 8. The MTJ cell 5 and the bitline 7 are formed on the connection layer 17 as a stacked structure.

A cell of the conventional magnetoresistive RAM comprises a transistor, a MTJ cell, a read wordline, a write wordline and a bitline. As a result, an effective area of the cell is increased, and the integration of the memory device is degraded.

SUMMARY OF THE INVENTION

Accordingly, it is an object of the present invention to provide a NAND-type magnetoresistive RAM comprising two or more NAND-type transistors sharing a source/drain region and a read node connected to a bitline and shared by a plurality of transistors, thereby reducing the effective area per cell and improving integration of a device.

There is provided a NAND-type magnetoresistive RAM comprising a plurality of transistors, a bitline, and a plurality of MTJ cells. The plurality of transistors are connected in series as a NAND-type, with each gate connected to each read wordline. The bitline is connected to a terminal transistor of the plurality of transistors connected in series at a read node. Each of the plurality of MTJ cells is connected to connection nodes of the plurality of transistors, and controlled by each write wordline.

There is also provided a NAND-type magnetoresistive RAM comprising a plurality of transistors, a plurality of read wordlines, a plurality of MTJ cells, a ground line, a plurality of write wordlines and a bitline. The plurality of transistors are formed on a P-substrate and connected in series as a NAND-type, and they are configured to that a source and a drain adjacent to the source share the connection node. The plurality of read wordlines are formed on gate regions of the plurality of transistors. Each of the plurality of MTJ cells are connected to the connection node of the two adjacent transistors among the plurality of transistors, respectively. The ground line is formed in common on the plurality of MTJ cells. The plurality of write wordlines are formed on the ground line, and correspond to the plurality of MTJ cells respectively. The bitline is connected via a read node to a terminal transistor among the plurality of transistors, and it is formed on the plurality of write wordlines.

DETAILED DESCRIPTION OF THE PREFERRED EMBODIMENTS

The present invention will be described in detail with reference to the accompanied drawings.

Figure 1:
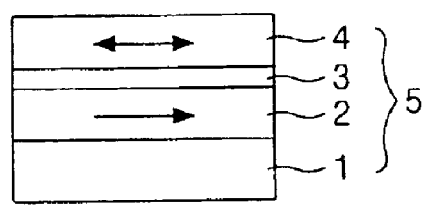
FIG. 1 illustrates a cross-sectional diagram of a conventional MTJ cell.
Figure 2A:
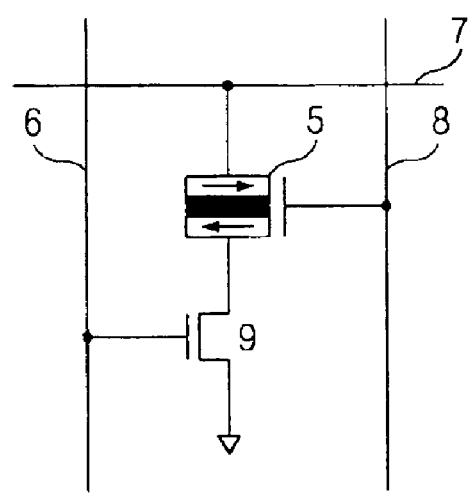
FIGS. 2a and 2b illustrates a mimetic diagram and a cross-sectional diagram of a conventional magnetoresistive RAM using a vertical field effect transistor.
Figure 2B:
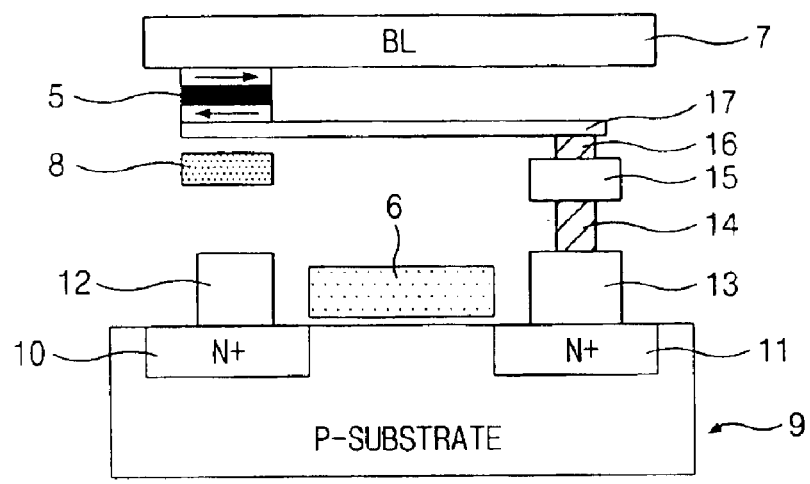
Figure 3:
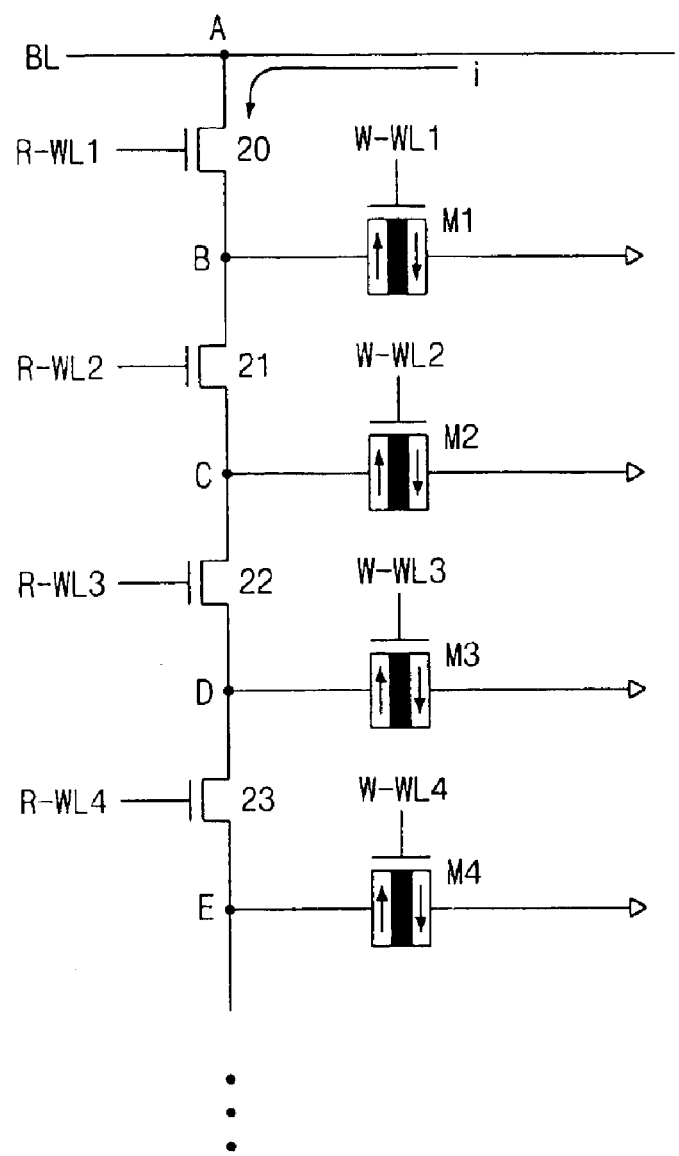
FIG. 3 illustrates a structural diagram of a NAND-type magnetoresistive RAM of the present invention.

FIG. 3 illustrates a structural diagram of a NAND-type magnetoresistive RAM of the present invention.

The NAND-type magnetoresistive RAM comprises a bitline BL, a plurality of NAND-type transistors 20~23, and a plurality of MTJ cells M1~M4.

The plurality of NAND-type transistors 20~23, which are connected in series between nodes A and E, each of the plurality of MTJ cells M1~M4 is connected to each connection node B~E. The other ends of the plurality of MTJ cells M1~M4 are connected to ground.

The plurality of NAND-type transistors 20~23 have each gate connected one by one to read wordlines R-WL1~R-WL4. The plurality of MTJ cells M1~M4 are connected one by one to write wordlines W-WL1~W-WL4.

The plurality of NAND-type transistors 20~23 are connected to the plurality of MTJ cells M1~M4, respectively, through at nodes B~E. The bitline BL is connected to a read node A.

As a result, the plurality of NAND-type transistors 20~23 are configured to share a read node A. This configuration can reduce an effective area per cell of a memory device, and improve integration of the device.

Figure 4:
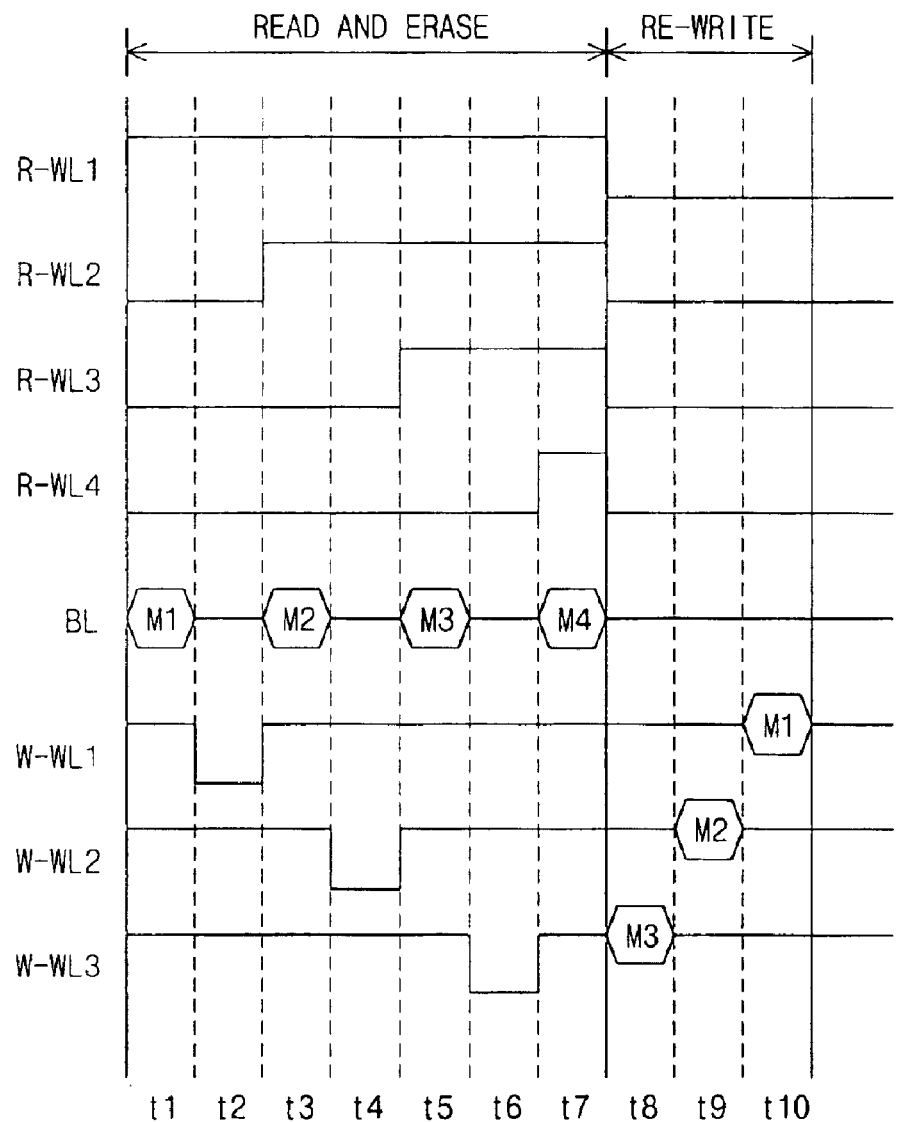
FIG. 4 illustrates a timing diagram of the NAND-type magnetoresistive RAM of the present invention.

FIG. 4 illustrates a timing diagram of the NAND-type magnetoresistive RAM of the present invention.

In a write mode of the NAND-type magnetoresistive RAM, the write wordlines W-WL1~W-WL4 connected one by one to the plurality of MTJ cells M1~M4 are individually enabled. In this case, the operation process is omitted because the operation process the NAND-type magnetoresistive RAM is the same as that of a general magnetic RAM.

In a read mode, a controller (not shown) sequentially reads data stored in the MTJ cells M1~M4 connected in series, and then temporarily stores the data in a register (not shown). After the read mode, the data stored in the register are sequentially restored in the MTJ cells M1~M4. The reason why the data read from the MTJ cells M1~M4 are temporarily stored in a read mode is that the previously read data need to be erased to read a next data correctly.

Referring to FIG. 4, in cycle t1, the read wordline R-WL1 connected to a gate of the first transistor 20 is enabled to a high level. If the first transistor 20 is turned on, data stored in the MTJ cell M1 connected to the node B is read.

In cycle t2, data "0" is stored in the MTJ cell M1 by using the write wordline W-WL1 connected to the first MTJ cell M1. Here, a resistance of tunneling junction of the MTJ cell M1 of the MTJ cell M1 becomes $R_H$ larger than $R_L$ when data "1" is written.

In cycle t3, data stored in the second MTJ cell M2 is read while the read wordline R-WL1 is maintained at a high level. In other words, if the read wordline R-WL2 is enabled to a high level, the second transistor 21 is turned on. As a result, the data stored in the second MTJ cell M2 connected to the node C is read.

Here, the amount of current i detected in the bitline BL is determined by resistance of the MTJ cells M1 and M2 connected in parallel. However, since the resistance of the MTJ cell M1 becomes $R_H$ in cycle t2, resistance of the MTJ cells M1 and M2 are affected by the resistance R2 of the MTJ cell M2.

After a data is read from a cell, the operation to erase the data from the cell is required. Thus, the register to temporarily store the read data is required.

In cycle t4, the resistance of the MTJ cell M2 becomes $R_H$. In cycle t5, third data stored in the MTJ cell M3 is read. If this procedure is repeated to cycle t7, data stored in the MTJ cell M1~M4 are all read.

Here, data stored in the final MTJ cell M4 need not be erased after it is read. As a result, in a re-write mode from cycle t8 to t9, data of the register is restored in the MTJ cells M1~M3.

The current values corresponding to data stored in the MTJ cell M1~M4 are as follows.

The current of the bitline BL in the MTJ cell M1 is represented by $$i1 = \frac{V}{R_1}.$$

The current of the bitline BL in the MTJ cell M2 is represented by $$i2 = \frac{V}{R_{tot}} \text{(here, } R_{tot} = \frac{R_1 R_2}{R_1 + R_2} = \frac{R_H R_2}{R_H + R_2}\text{)}.$$

The current of the bitline BL in the MTJ cell M3 is represented by $$i3 = \frac{V}{R_{tot}} \text{(here, } R_{tot} =$$

$$\frac{R_1 R_2 R_3}{R_1 R_2 + R_2 R_3 + R_1 R_3} = \frac{R_H R_H R_3}{R_H R_H + R_H R_3 + R_H R_3} = \frac{R_H R_3}{R_H + 2R_3}\text{)}.$$

The current of the bitline BL in the MTJ cell M4 is represented by $$i4 =$$

$$\frac{V}{R_{tot}} \text{(here, } R_{tot} = \frac{R_1 R_2 R_3 R_4}{R_1 R_2 R_3 + R_1 R_2 R_4 + R_2 R_3 R_4 + R_1 R_3 R_4} = \frac{R_H R_4}{R_H + 3R_4}\text{)}.$$

As a result, the following table shows the current values corresponding to data stored in each MTJ cell M1~M4 (here, $R_H >> R_L$)

TABLE 1

|  | In storing data "0" ($R_i = R_H$) | Compare | in storing data "1" ($R_i = R_L$) |
| --- | --- | --- | --- |
| i1 (BL current in M1) | $V/R_H$ | << | $V/R_L$ |
| i2 (BL current in M2) | $V/2R_H$ | << | $V/R_L$ |
| i3 (BL current in M3) | $V/3R_H$ | << | $V/R_L$ |
| i4 (BL current in M4) | $V/4R_H$ | << | $V/R_L$ |

According to the present invention, significant data consists of a plurality of bits. The significant data is stored in cells connected in series, and then read sequentially. As a result, it is unnecessary to consider the difference in operation speed when the present invention is compared to the conventional one.

Also, it is unnecessary to consider an additional area because only a register large enough to store bits from MTJ cells M1~M4 connected in series is required.

It is preferable that write and read operations of the present invention are controlled by a controller. The explanation on the controller is omitted because the controller has the same configuration as that of the magnetic RAM.

Figure 5:
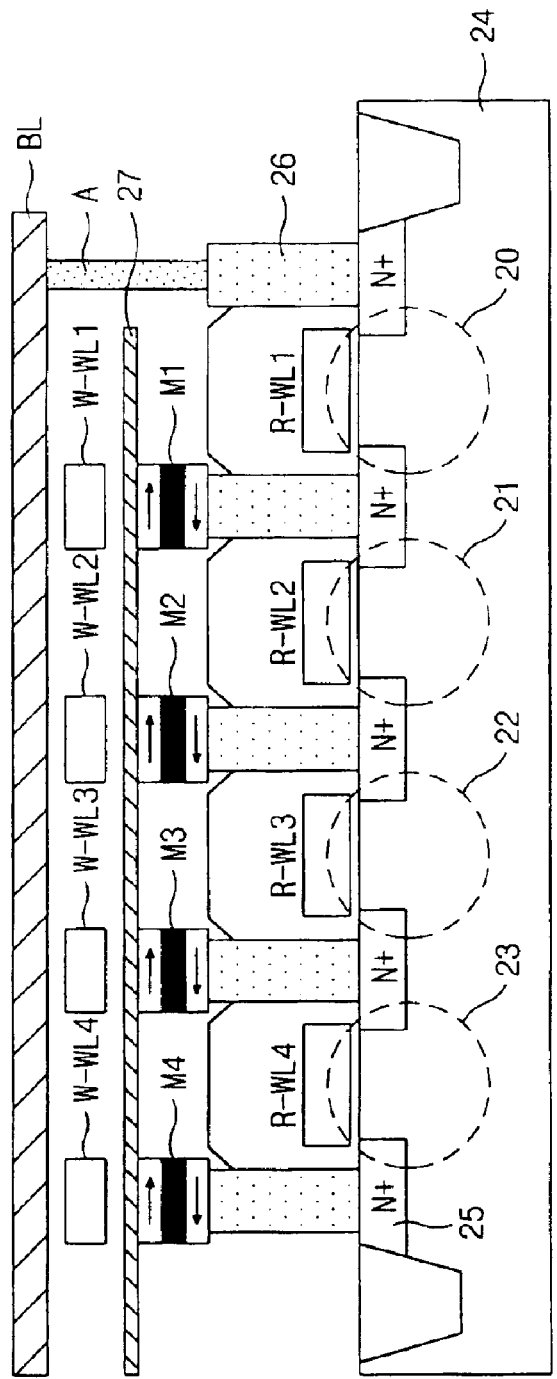
FIG. 5 illustrates a cross-sectional diagram of the NAND-type magnetoresistive RAM of the present invention.

FIG. 5 illustrates a cross-sectional diagram of the NAND-type magnetoresistive RAM of the present invention.

The plurality of transistors 20~23 are connected in series on a P-substrate 24 without having inactive regions. Each transistor 20~23 are configured to that a source region 25 and adrain region 25 adjacent to the source region 25 share a common N-well region.

The plurality of MTJ cells M1~M4 are connected to the source/drain regions 25 (the common N-well region)of the plurality of transistors 20~23 at each contact region 26. The contact region 26 of the final terminal is connected to the bitline BL at the read node A.

The read wordlines R-WL1~R-WL4 are formed on gates of the plurality of transistors 20~23 respectively. A ground line 27 is formed on the MTJ cells M1~M4. The write wordlines W-WL1~W-WL4 for writing data in the MTJ cells M1~M4 are formed on the ground line 27 perpendicular to the bitline BL.

The MTJ cells M1~M4 are located at positions where the write wordlines W-W14~W-WL4 are crossing the bitline BL at right angles. Here, data can be written in the corresponding MTJ cells M1~M4 because the intensity of field applied to the MTJ cells M1~M4 is largest.

As discussed earlier, a NAND-type magnetoresistive RAM of the present invention comprises a node shared by a plurality of cells, and a plurality of transistors connected in series, thereby reducing inactive regions. As a result, the effective area per cell can be decreased, and the integration of a device can be improved.

What is claimed is:

1. A NAND-type magnetoresistive RAM, comprising:

a plurality of transistors having gates to be connected one-by-one to a plurality of read wordlines and being connected in series as a NAND-type;

a bitline connected to a terminal transistor of the plurality of transistors connected in series at a read node; and a plurality of MTJ cells each of which being connected to a connection node of two adjacent transistors, and each of which being controlled by a corresponding write wordline.

2. The NAND-type magnetoresistive RAM of claim 1, further comprising a register for temporarily storing data sequentially read from the plurality of MTJ cells in a read mode.

3. The NAND-type magnetoresistive RAM of claim 2, further comprising a controller for erasing data sequentially read from the plurality of MTJ cells in the read mode, and for sequentially restoring data stored in the register into the plurality of MTJ cells at the end of the read mode.

4. The NAND-type magnetoresistive RAM of claim 3, wherein the controller reads and maintains data stored in the final MTJ cell of the plurality of MTJ cells.

5. The NAND-type magnetoresistive RAM of claim 3, wherein the controller controls the read wordlines to be sequentially enabled, from the read wordline connected to a gate of a transistor nearest to the read node, and to be maintained at an enable state until a final transistor is turned on.

6. The NAND-type magnetoresistive RAM of claim 3, wherein the controller controls write wordlines to be individually enabled in a write mode.

7. The NAND-type magnetoresistive RAM of claim 1, wherein other ends of the plurality of MTJ cells are connected to ground.

* * * * *